US009856133B2

(12) United States Patent
Boillot et al.

(10) Patent No.: US 9,856,133 B2
(45) Date of Patent: Jan. 2, 2018

(54) MEMS-SENSOR

(71) Applicant: TRONICS MICROSYSTEMS S.A., Crolles (FR)

(72) Inventors: François-Xavier Boillot, Grenoble (FR); Rémi Laoubi, Grenoble (FR)

(73) Assignee: TRONICS MICROSYSTEMS S.A., Crolles (FR)

( * ) Notice: Subject to any disclaimer, the term of this patent is extended or adjusted under 35 U.S.C. 154(b) by 98 days.

(21) Appl. No.: 14/891,033

(22) PCT Filed: May 21, 2014

(86) PCT No.: PCT/EP2014/001373
§ 371 (c)(1),
(2) Date: Nov. 13, 2015

(87) PCT Pub. No.: WO2014/191092
PCT Pub. Date: Dec. 4, 2014

(65) Prior Publication Data
US 2016/0130133 A1    May 12, 2016

(30) Foreign Application Priority Data

May 31, 2013   (EP) .................................... 13290121

(51) Int. Cl.
| G01P 15/08 | (2006.01) |
| B81B 3/00 | (2006.01) |
| G01C 19/5747 | (2012.01) |
| B81B 7/02 | (2006.01) |
| G01C 19/5762 | (2012.01) |

(52) U.S. Cl.
CPC .......... *B81B 3/0021* (2013.01); *B81B 3/0048* (2013.01); *B81B 7/02* (2013.01);
(Continued)

(58) Field of Classification Search
CPC ................ G01C 19/56; G01C 19/5719; G01C 19/5733; G01C 19/574; G01C 19/5747;
(Continued)

(56) References Cited

U.S. PATENT DOCUMENTS 6,480,320 B2 * 11/2002 Nasiri ................ G02B 26/0841
359/290
2004/0008400 A1   1/2004 Hill et al.
(Continued)

FOREIGN PATENT DOCUMENTS

DE   10 2008 043 753 A1   5/2010
DE   10 2011 080 980 A1   2/2013
(Continued)

*Primary Examiner* — Benjamin Schmitt
(74) *Attorney, Agent, or Firm* — Birch, Stewart, Kolasch & Birch, LLP

(57) ABSTRACT

A sensor which measures parameters such as acceleration, rotation and magnetic field comprises a substrate defining a plane and at least one sensing plate suspended above the substrate for movement in a sensing direction orthogonal to the substrate plane. A detection arm suspended above the substrate is rotational about an axis parallel to the substrate plane. An out-of-plane coupling structure couples the sensing plate to the detection arm for generating rotational movement of the detection arm, which is detected by a rotation detection structure. A pivot element arranged at a distance from the coupling structure facilitates tilting movement of the sensing plate.

21 Claims, 6 Drawing Sheets

(52) U.S. Cl.
CPC ..... *G01C 19/5747* (2013.01); *G01C 19/5762* (2013.01); *G01P 2015/0837* (2013.01)

(58) Field of Classification Search
CPC . G01C 19/5755; G01C 19/5762; G01P 15/02; G01P 15/08; G01P 15/0802; G01P 2015/0805; G01P 2015/082; G01P 2015/0837; G01P 2015/0854; B81B 3/0021; B81B 3/0048; B81B 3/0051; B81B 3/0062; B81B 2201/0235; B81B 2203/0181
USPC ....... 73/504.01, 504.02, 504.08, 504.12, 510
See application file for complete search history.

(56) References Cited

U.S. PATENT DOCUMENTS

| | | | |
|---|---|---|---|
| 2008/0115579 A1* | 5/2008 | Seeger | G01C 19/5712 73/504.12 |
| 2009/0139342 A1 | 6/2009 | Robert et al. | |
| 2010/0186506 A1 | 7/2010 | Robert | |
| 2010/0186510 A1 | 7/2010 | Robert | |
| 2011/0219875 A1 | 9/2011 | Walther et al. | |
| 2011/0304325 A1 | 12/2011 | Walther et al. | |
| 2012/0006123 A1 | 1/2012 | Walther et al. | |
| 2012/0017693 A1 | 1/2012 | Robert et al. | |
| 2012/0018244 A1 | 1/2012 | Robert | |
| 2012/0210792 A1 | 8/2012 | Robert et al. | |

FOREIGN PATENT DOCUMENTS

| | | |
|---|---|---|
| FR | 2 924 422 A1 | 6/2009 |
| FR | 2 941 525 A1 | 7/2010 |
| FR | 2 941 533 A1 | 7/2010 |
| FR | 2 941 534 A1 | 7/2010 |
| FR | 2 951 826 A1 | 4/2011 |
| FR | 2 957 414 A1 | 9/2011 |
| FR | 2 962 532 A1 | 1/2012 |
| FR | 2 963 099 A1 | 1/2012 |
| FR | 2 963 192 A1 | 1/2012 |

* cited by examiner

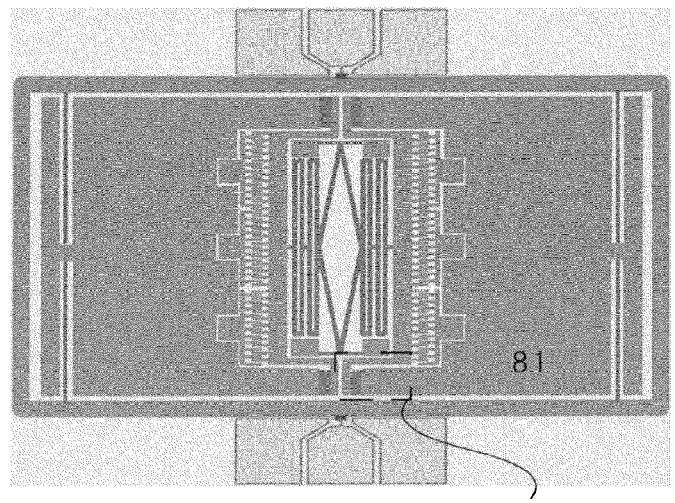
Fig. 7a
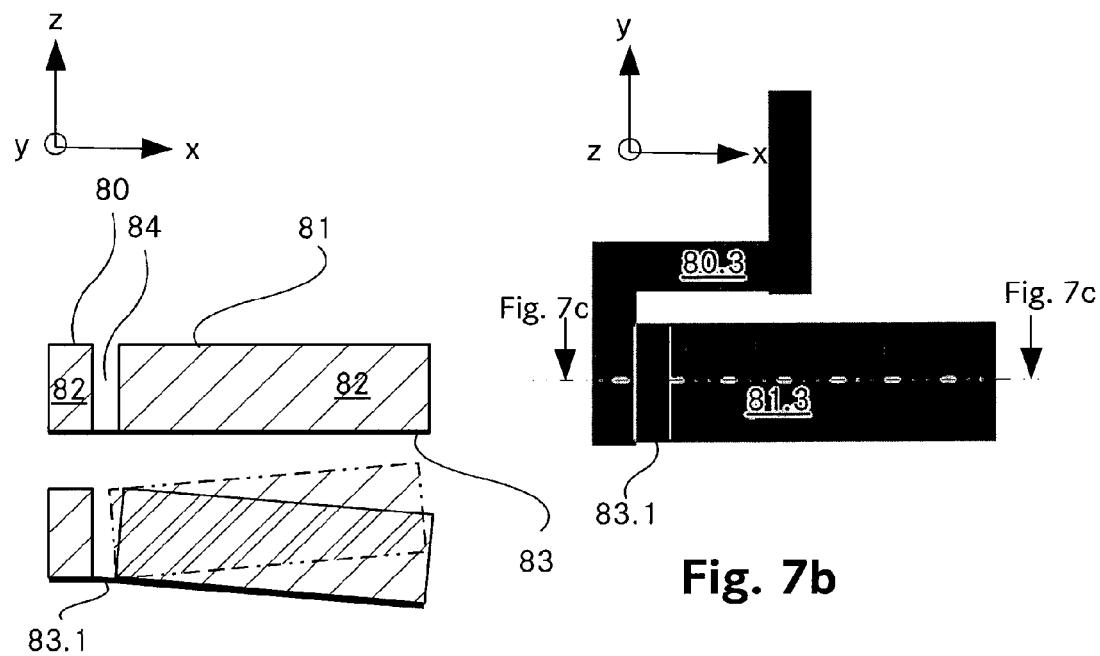
Fig. 7b
Fig. 7c

MEMS-SENSOR

TECHNICAL FIELD

The invention relates to a sensor for measuring physical parameters such as acceleration, rotation, magnetic field, comprising
a) a substrate defining a substrate plane,
b) at least one sensing plate suspended above the substrate for performing a movement having at least a first component in a sensing direction, wherein the sensing direction is orthogonal to the substrate plane,
c) at least one detection arm that is suspended above the substrate for performing a rotational movement about a rotation axis parallel to the substrate plane,
d) an out-of-plane coupling structure for coupling the first component of the movement of said sensing plate to said detection arm for generating the rotational movement of the detection arm,
e) a rotation detection structure cooperating with the arm for detecting the rotational movement of the detection arm with respect to the substrate plane.

BACKGROUND ART

FR 2 951 826 A (CEA) and FR 2 957 414 A (CEA) show a sensor for detecting a force with a rectangular seismic mass that is actuated in x-direction and that is deflected by the Coriolis force in y-direction. The seismic mass is suspended by a hinge that allows rotation of the seismic mass about the z-axis. The rotation about the hinge is detected by a piezoresistive gauge.

FR 2 962 532 A (CEA) shows a sensor for detecting Coriolis forces in two different directions of rotation. The sensor comprises three different seismic masses. The axis of excitation is parallel to z and the detection directions correspond to x and y axes. The excitation mass has the shape of a circular ring and it surrounds the detection mass which is in the centre of the sensor.

FR 2 963 099 A (CEA) and FR 2 963 192 A1 (CEA) show a MEMS sensor for detecting and generating dynamic pressure (microphone, loudspeaker). The pressure variation effects a rotational movement of a pivoting element and the movement is detected by a piezoresistive gauge wire. Another embodiment uses a linear movement of a detection mass and a capacitive detection system (comb electrodes).

FR 2 941 534 A (CEA) discloses a magnetic sensor having a mobile mass that is pivotably connected to an anchor by a hinge. The mass is provided with a magnetic layer that invokes a force rotating the mass in the external magnetic field.

FR 2 941 533 A (CEA) discloses a MEMS structure with a gauge for detecting out-of-plane movements of the mobile mass.

FR 2 941 525 A (CEA) discloses a MEMS structure having two masses that are coupled by two arms. The arms are rotatable about an in-plane axis. The two masses are actuated in-plane and perform an out-of-plane movement that transforms into a balancing movement of the arms.

FR 2 924 422 A (CEA) discloses an amplifier for a piezoresistive gauge wire.

SUMMARY OF THE INVENTION

It is the object of the invention to provide a sensor pertaining to the technical field initially mentioned, wherein the sensor has a high sensitivity and uses less chip area.

The solution of the invention is defined by the features of claim 1. According to the invention sensor for measuring physical parameters such as acceleration, rotation, magnetic field or pressure, comprises
a) a substrate defining a substrate plane,
b) at least one sensing plate suspended above the substrate for performing a movement having at least a first component in a sensing direction, wherein the sensing direction is orthogonal to the substrate plane,
c) at least one detection arm that is suspended above the substrate for performing a rotational movement about a rotation axis parallel to the substrate plane,
d) an out-of-plane coupling structure for coupling the first component of the movement of said sensing plate to said detection arm for generating the rotational movement of the detection arm,
e) a rotation detection structure cooperating with the arm for detecting the rotational movement of the detection arm with respect to the substrate plane,
f) and a pivot element arranged at a distance from the out-of-plane coupling structure, said pivot element coupling the sensing plate to a reference plane, which is at a fixed distance above the substrate, so that the sensing plate performs a tilting out-of-plane movement.

The substrate may be any support (mechanical carrier) that is suitable for implementing a Micro Electro-Mechanical System (MEMS). Preferably, the substrate is suitable for NEMS (Nano Electro-Mechanic Machined System). For instance, the substrate may consist of mono-crystalline silicon or glass. The substrate may be a flat plate. The surface of the substrate defines a plane (x-y plane). Any directions parallel to said plane are called "in-plane" and any directions not parallel to the substrate plane (e.g. z direction) are called "out-of-plane".

The sensor has at least one sensing plate which is suspended above the substrate. The suspension is achieved by a structure that enables out-of-plane movements. The sensing plate is, therefore, able to perform a movement in a direction that has at least a component in a sensing direction, wherein the sensing direction (z-axis) is orthogonal to the substrate plane. The suspension structure of the sensing plate may also allow movements having a direction component parallel to the substrate plane. The sensing plate is a structure that has a thickness that is smaller than the smallest dimension parallel to the substrate plane.

The sensor has at least one detection arm that is suspended above the substrate for performing a rotational movement about a rotation axis that is parallel to the substrate plane. Generally speaking, the detection arm may have any shape in the plane parallel to the substrate plane. However, it is preferable that the detection arm has a mass that is small compared to the mass of the sensing plate. The arm forms a stiff lever that is able to swing out-of-plane (i.e. the arm is able to perform a movement that has a vector-component in a direction orthogonal to substrate plane). The swinging movement of the arm is a rotation about an axis that is parallel to the substrate plane.

An out-of-plane coupling structure provides a coupling in the direction of the first component of the movement of said sensing plate to said detection arm. As a consequence, the out-of-plane movement of the sensing plate is transmitted to the arm and makes the arm rotate about its axis of rotation.

The rotation of the arm is detected by the rotation detection structure. This structure cooperates with the arm and detects the rotational movement of the detection arm with respect to the substrate plane. The detection structure may comprise an electrostatic or a piezoresistive element that transforms the out-of-plane displacement of the detection arm into an electric signal.

A pivot element for coupling the sensing plate to a geometric reference plane is arranged at a distance from the out-of-plane coupling structure. Said pivot element also has a certain radial distance from the y-axis of the sensor (i.e. from the axis of rotation of the detection arm).

Due to the distance between the out-of-plane coupling structure, on one hand, and the pivot element, on the other hand, the sensing plate is performing a tilting movement with respect to the substrate plane, when a force normal to the substrate plane acts on the sensing plate. The smaller the distance is between the rotational axis of the detection arm and the pivot element, the smaller is the tilting angle between the sensing plate and the detection arm. Generally speaking, it is advantageous to have a small tilting angle. The pivot element is preferably close to the axis of rotation of the detection arm.

Advantages

The sensor of the invention can be implemented on a smaller area than the sensors of the prior art. The sensor needs less complex springs for suspension and for coupling of the structural elements. A further advantage of the invention is that the movement of the sensing plates is directly transmitted to the detection arm. Therefore, the energy of the out-of-plane movement of the sensing plate is more efficiently used and the sensitivity of the sensor is increased compared to the prior art.

Drive Mass:

The sensor may further comprise a drive mass suspended for performing a movement in drive direction parallel to the substrate plane and a drive structure for actuating the drive mass in drive direction. The drive mass may be suspended in such a way that it is able to vibrate in x direction (which is orthogonal to the rotation axis of detection arm). Preferably, the suspension of the drive mass prevents a movement orthogonal to the drive direction. That is, the drive mass only moves in-plane and does not move in z-direction (out-of-plane).

In comparison with FR 2 941 525 A1 the cross-talk between movements in x-direction and in z-direction is eliminated.

It is also possible to drive the sensing plate directly by electrostatic means (comb electrodes) and without a separate drive mass. The actuation may take place in a similar way as shown in FIG. 1A of FR 2 941 525 A1 (CEA).

Sensors with two masses (bi-mass sensors) that are actuated at a certain frequency to detect a physical parameter are called tuning-fork sensors.

For non-resonant applications the drive mass, that is separate from the sensing plate, is not necessary.

Coupling of Drive Mass:

According to a specific embodiment of the invention, the drive mass is coupled to the sensing plate by a pivot element. When the drive mass is suspended such that it is mobile only parallel to the substrate plane but not normal to said plane, one axis of the sensing plate (namely the axis of rotation defined by the pivot element) is kept in the reference plane. The out-of-plane movement of the sensing plate takes place at a distance from the pivot element.

While it is preferable that the pivot element only allows a rotation of the sensing plate about the pivot axis, it may alternatively be acceptable, that the pivot element has also some resilience orthogonal to the rotation axis of the detection arm. It may even have a certain (but minor) resilience in z-direction.

According to a specific embodiment of the invention said pivot element is v-shaped. For instance, the pivot element substantially consists of two beams that are joined at one of their ends and that are running apart from each other at the other of their ends at an angle >0° and <90°. The separate ends of the v-shaped pivot element may be connected to the drive mass and the joint end of the pivot element may be connected to the sensing plate. The two beams are preferably symmetrical with respect to each other so that the axis of symmetry of the v-shaped pivot element defines the pivot axis. The orientation of the v-shaped pivot may also be in opposite direction.

The beams of the pivot are preferably stiff against deformation in z-direction (orthogonal to the substrate plane). Even though each beam is flexible transversely to its longitudinal axis and rotatable about its longitudinal axis, the pivot element has only the required freedom of rotation about the pivot axis.

It is also possible to use a structure that is different e.g. a straight beam that is sufficiently stiff against deformation in x and z direction but soft against torsion in y direction.

According to another preferred embodiment, the pivot element is a flexible sheet-like element. It may be a part of a thin layer that extends from the drive mass to the sensing plate, wherein the thin layer is connected to the drive mass on the one side and to the sensing plate on the other side.

Detection Arm:

In a particular embodiment the detection arm is part of a frame structure that is surrounding the sensing plate. That is, the arm makes up one side of the frame. In fact, the frame is typically a rectangle that is suspended to be rotatable about one of its axis of symmetry. Of course, other shapes of the frame are possible (hexagonal, partially circular) but more complex.

Preferably, the frame is symmetrical in x- and y-direction and is suspended at two points on opposite sides of the frame. So each of the two opposite sides may represent a detection arm and a rotation detection structure can be provided for each side.

According to another preferred embodiment the detection arm is arranged in an opening of the sensing plate. The detection arm may be the innermost element of the three elements: detection arm, sensing plate and drive mass.

Symmetry:

It is most preferred that the sensing plate, the drive mass and the detection arm are symmetric with respect to an axis that is parallel to the substrate plane and orthogonal to the rotation axis of the detection arm (x-axis). Symmetrical designs are more stable than non-symmetrical designs. In addition, symmetrical designs are the basis for the preferred anti-phase operation. Therefore, it is preferable to have a MEMS structure that is symmetric in x and y direction.

Drive Mass:

In a particular embodiment the drive mass is a micromachined structure that has the shape of a frame (in the top plan view). That means, that there is a free area within the drive mass that can be used for placing drive elements (such as electrodes), anchors, spring elements, coupling elements or pivot elements. For instance, the drive mass may have the shape of a rectangle substantially consisting of four straight beams. One of the beams may be split into two sections so that an opening or gap exists that can serve as a transit.

The frame of the detection structure may surround the sensing plate. In particular, said frame may surround the sensing plate. However, it is also possible to have a frame-shaped detection structure that does not surround the sensing plate or that is even inside the sensing plate. The detection structure may be a single straight beam.

According to a preferred embodiment the out-of-plane coupling structure is outside an area encompassed by the drive mass. That means, if the drive mass is a frame the out-of-plane coupling structure is outside and not inside the frame.

The out-of-plane coupling element enables a decoupling between the detection arm and the sensing mass with respect to the drive direction (x-axis).

According to another embodiment, the out-of-plane coupling structure is inside an area encompassed by the drive mass. That is, the drive mass may have an opening in which the coupling structure is placed.

According to a preferred embodiment an electrostatic drive unit for generating the drive movement is arranged inside the area encompassed by the detection frame. In particular, the drive unit is also within the area encompassed by the drive mass. The main advantage of such geometry is that the drive mass (which has preferably the shape of a drive frame) becomes more compact.

In another specific embodiment the electrostatic drive unit for generating the drive movement is arranged outside the area encompassed by the drive mass. The drive unit may be at the outermost end (with respect to the pivoting axis of the detection structure) of the drive mass.

Anti-Phase Operation:

Anti-phase operation reduces the effects of perturbances on the detection signal, for instance the undesired influence of linear acceleration in x, y or z direction. Therefore, it is preferred to provide a second sensing plate and a second out-of-plane coupling structure for coupling the first component of the movement of said second sensing plate to said detection arm for generating the rotational movement of the detection arm.

Further more, the sensor preferably comprises an anti-phase coupling structure for anti-phase coupling of the movements of the first and the second sensing plate in drive direction.

The anti-phase coupling structure may be anchored to the substrate. This increases the stability of the vibrational system.

Anchor:

According to a specific embodiment of the invention the drive mass is flexibly connected to an anchor arranged outside the area encompassed by the drive mass and inside the area encompassed by the sensing plate. Alternatively the anchor may be outside the area encompassed by the drive mass. It is also possible to flexibly connect the drive mass to an anchor arranged outside the area encompassed by the drive mass.

Detection Structure:

The detection structure may comprise a flexible layer that functions as a piezoresistive element that transforms the out-of-plane displacement of the detection arm into an electric signal. Preferably the rotation detection structure comprises a piezoresistive nano-wire gauge. Such a gauge can be implemented on a small area. Therefore, the total chip-area consumed by sensor with nano-wire gauge is smaller than the area consumed by a sensor with electrostatic detection means. However, the movement of the detection arm may alternatively be detected with an electrostatic structure or a resonator gauge.

Nano-wire gauges are known e.g. from FR 2 941 525 A1 (CEA) and electronic amplification from FR 2 924 422 A1 (CEA).

The sensor design of the invention is preferably used for y-axis gyroscopes. However, it may also be advantageous for linear z-axis acceleration. Furthermore, the design may also be suitable for magnetic field detection. Or even pressure variations may be detected if a decent hollow space is provided under the sensing plate, so that the sensing plate is pushed in z-direction when the pressure in the hollow space increases with respect to the pressure above the sensing plate. The hollow space may communicate with the backside of the substrate, so that the pressure at the backside is determined.

It is to be noted, that for magnetometer, accelerometer and pressure sensor devices there is generally speaking no need for activation electrodes or for anti phase coupling devices.

Other advantageous embodiments and combinations of features come out from the detailed description below and the totality of the claims.

BRIEF DESCRIPTION OF THE DRAWINGS

The drawings used to explain the embodiments show:

FIG. 7*a, b, c* an alternative embodiment to FIG. 6 in which the v-shaped pivot is replaced by a NEMS layer connection;

In the figures, the same components are designated with the same reference symbols.

PREFERRED EMBODIMENTS

Figure 1:
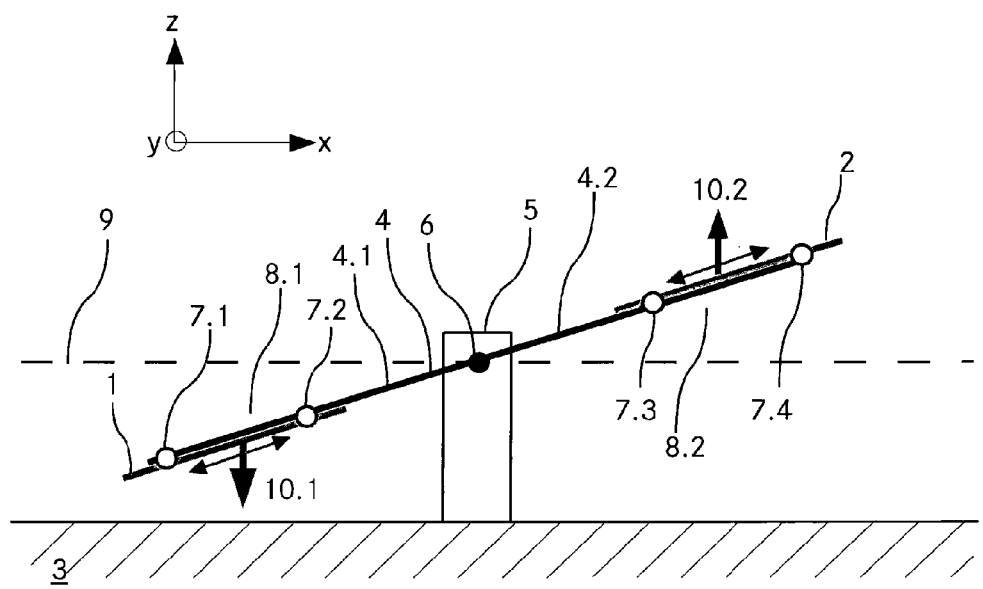
FIG. 1 A schematic representation of the out-of-plane movement of a tuning-fork sensor according to the prior art.

FIG. 1 shows the out-of-plane movement of the sensor disclosed in FR 2 941 525 A (CEA). There are two sensing plates 1, 2 suspended above the substrate 3. The two sensing plates are coupled by lever 4 having two arms 4.1, 4.2. The lever 4 is connected to an anchor 5 via a pivot 6, which defines an axis of rotation parallel to the substrate 3 in y-direction. The two sensing plates 1, 2 are coupled to the arms 4.1, 4.2 by springs 7.1, . . . , 7.4, which are flexible in a direction parallel to the lever 4 but stiff in a direction parallel to the axis of rotation of the pivot 6 (y-direction) and in z-direction. An electrostatic drive (not shown) is coupled to the sensing plates 1, 2 and generates a vibrational movement 8.1, 8.2 in x-direction.

When there is no angular rate (or Coriolis force), the lever 4 and the plates 1, 2 are in the reference plane 9 parallel to the substrate 3. For detecting a force in y-direction the plates are driven to vibrate in x-direction (8.1, 8.2). If a rotation rate impacts the sensor, the Coriolis force 10.1, 10.2 acts in z-direction and effects an out-of-plane movement of the sensing plates 1, 2. This movement is coupled to the arms 4.1, 4.2 and the out of plate angle of the arm 4 is detected by a nano-wire gauge.

Figure 2:
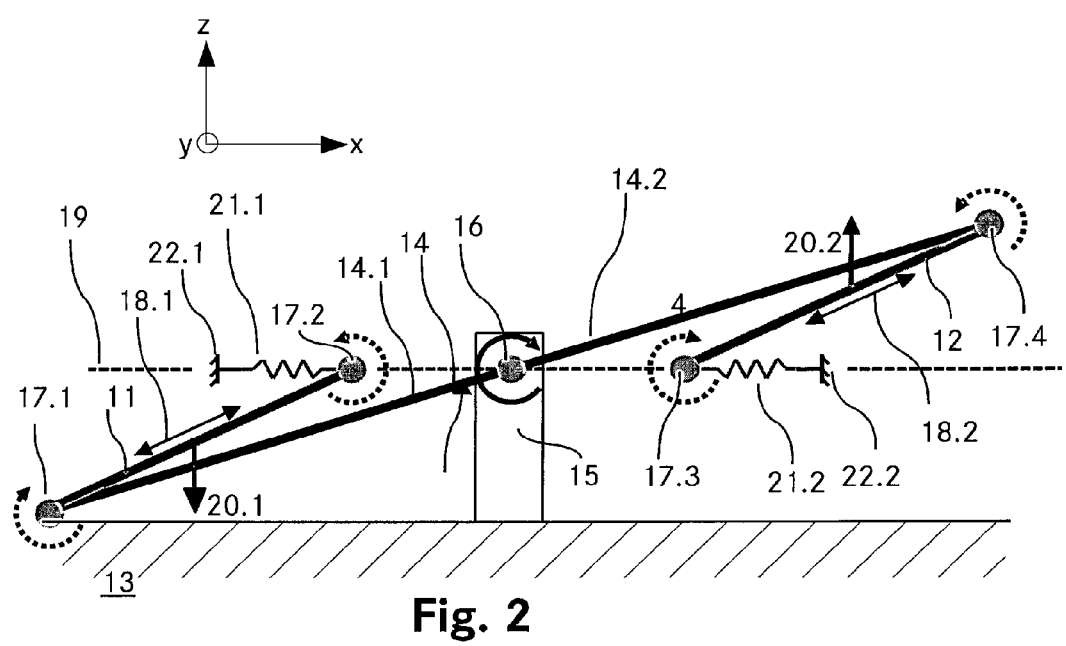
FIG. 2 A schematic representation of the out-of-plane movement of the tuning-fork sensor according to a first embodiment of the invention.

FIG. 2 shows a preferred embodiment of the concept of the invention. There are two sensing plates 11, 12 suspended above the substrate 13. The two sensing plates 11, 12 are coupled by lever 14 having two arms 14.1, 14.2 on opposite sides of the pivot 16. The lever 14 is connected to an anchor 15 via a pivot 16, which defines an axis of rotation parallel to the substrate 13 in y-direction. The two sensing plates 11, 12 are each coupled at the outer end to the arms 14.1, 14.2 by a pivot 17.1, 17.4, respectively. Two additional pivots 17.2, 17.3 are used to couple each inner end of the sensing plates 11, 12 to the reference plane 19. According to the concept shown in FIG. 2, the structure to couple the inner end of the sensing plates 11, 12 to the reference plane 19 comprises springs 21.1, 21.2 connecting the pivots 17,2, 17.3 to an anchor 22.1, 22.2, respectively.

Therefore, each of the sensing plates is suspended by two different pivots. The outer pivot 17.1, which is further away from the axis of rotation of the pivot 16 than the inner pivot 17.2, transmits the out-of-plane (z-axis) movement of the sensing plate to the detection arm 14.1. And the inner pivot 17.2, which is close to the axis of rotation of the pivot 17, has the effect that the sensing plate makes a tilting plate movement if there is an out-of-plane force acting on the sensing plate 11.

An electrostatic drive (not shown) is coupled to the sensing plates 1, 2 and generates a vibrational movement 18.1, 18.2 in x-direction.

When there is no force acting on the plates 11, 12, the lever 14 and the plates 11, 12 are in the reference plane 19 parallel to the substrate 13. For detecting an acceleration in z-direction the plates are driven to vibrate in x-direction (by a drive system not shown). The device can be used for detecting y-axis rotation rates, if sensing plates 11, 12 are designed to have a sufficiently high mass for generating a sufficiently high force in z-direction.

If an acceleration impacts the sensor, the Coriolis force 20.1, 20.2 acts in z-direction and effects an out-of-plane tilting movement of the sensing plates 11, 12. This movement is transferred to the arms 14.1, 14.2 and the out-of-plane angle of the lever 14 is detected by a nano-wire gauge (not shown).

The basic system shown in FIG. 2 may also be used to detect a magnetic field. For this purpose, the plates 11, 12 have to be provided with a layer of magnetic material as disclosed e.g. in FR 2 941 534 A (CEA). A magnetic field in z-direction will generate a force that rotates the plates 11, 12 similar to the Coriolis force shown in FIG. 2. For detecting a magnetic field or a z-axis acceleration it is also possible to use an asymmetric structure. In such a structure, drive means are not necessary.

A sensor just comprising the elements shown on the right-hand side of FIG. 2 (sensing plate 12, arm 14.2, pivots 16, 17.3, 17.4, spring 21.1, anchors 15 and 22) may be sufficient, in particular for linear z-axis acceleration. Such a modified sensor is asymmetric.

Figure 3:
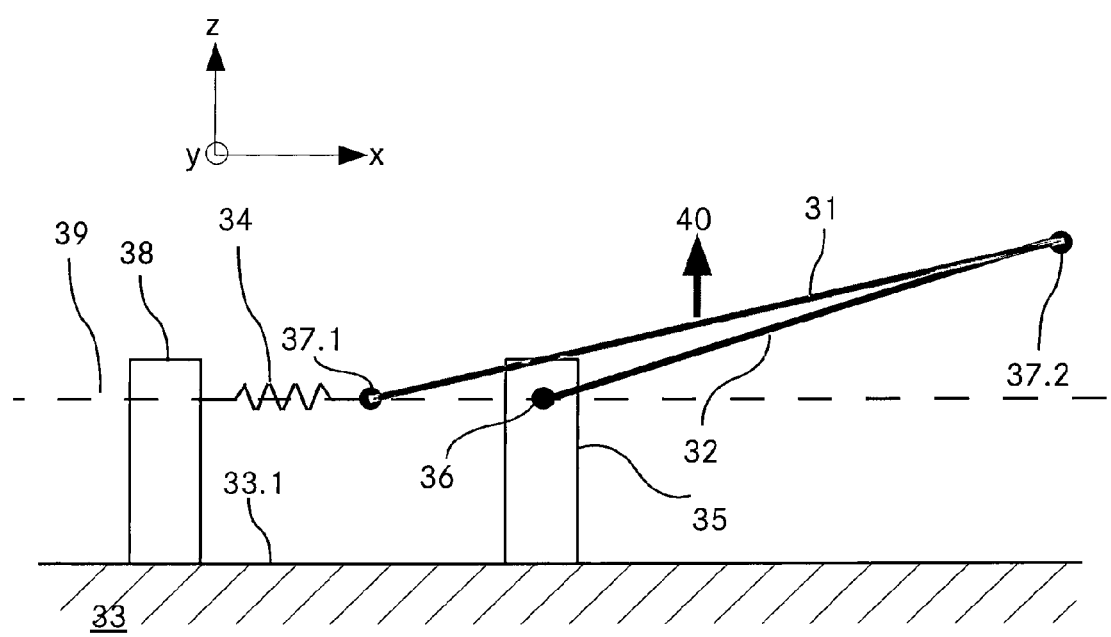
FIG. 3 A schematic representation of an alternative embodiment of the invention for out-of-plane acceleration detection or for magnetic field detection.

FIG. 3 shows an embodiment of the invention that provides a higher sensitivity for the tilt angle of the sensing plate. This is achieved by providing a sensing plate 31 that is longer in x-direction than the detection arm 32. One end of the detection arm 32 is connected to the anchor 35 by a pivot 36 and the other end (in x-direction) of the detection arm 32 is connected by a pivot 37.2 to a first end of the sensing plate 31. The second end of the sensing plate 31 is coupled to the reference plane 39 by a pivot 37.1. The pivot 37.1 is coupled via spring 34 to an anchor 38. The spring 34 is flexible in x-direction but stiff in y- and z-direction.

The anchors 35, 38 are fixed on the substrate 33. They may be immobile parts of the micro-machined layer (e.g. of the SOI layer=Silicon on Insulator). The substrate has a surface 33.1. There may be hollows in the substrate 33 for providing a space for the out-of-plane movement of the sensing plates.

The reference plane 39 is defined by the axes of the pivot 36 (which is the out-of-plane coupling) and the pivot 37.1 (which is the rotation axis of the detection arm).

If the plate 31 carries a magnetic layer that acts as a permanent magnet and if there is a magnetic field in z-direction, the plate 31 will experience an out-of-plane force 40 and will perform an out-of-plane tilt-movement. Because the pivots 37.1 and 37.2 are on opposite sides of the pivot 39 of the detection arm the tilt angle of the arm 32 is larger than the tilt angle of the sensing plate 31. This is different from FIG. 2 where the pivots 17.1 and 17.2 of the sensing plate 11 are on the same side of the pivot 16 of the detection arm 14.1.

The structure shown in FIG. 3 is preferably used for implementing a magnetometer or a Z accelerometer. It is to be noted that a magnetic field sensor does not have to be of the tuning-fork type.

Figure 4:
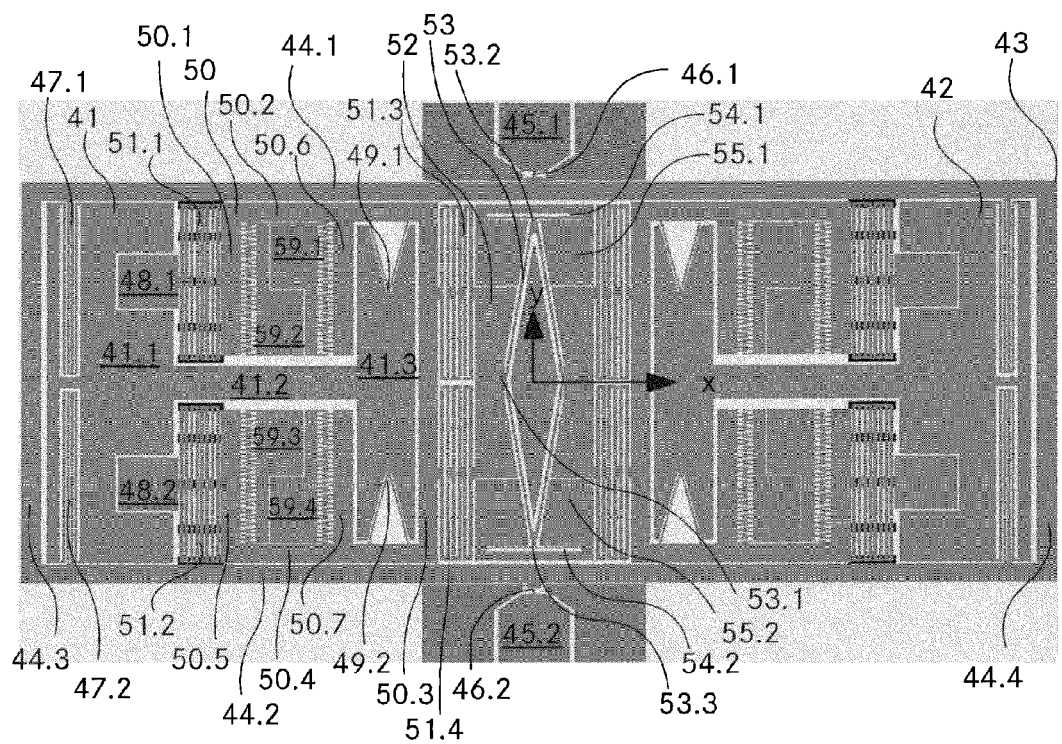
FIG. 4 a top plan view of a preferred embodiment of the invention.

FIG. 4 shows the top plan view of the MEMS structure of a preferred y-axis gyroscope according to a particular embodiment of the invention. The geometric design is symmetrical with respect to x and y direction. Therefore, the following description is limited to one side of the symmetrical design.

There are two sensing plates 41, 42 which define the sensing mass of the tuning-fork type sensor. The sensing plates 41, 42 are enclosed within a rectangular detection frame 43. The long sides of the frame 43 are parallel to x direction and define each a detection lever 44.1, 44.2. The free ends of the detection levers 44.1, 44.2 are connected by two connection beams 44.3, 44.4, which are parallel to y-direction and define a closed rectangle together with the detection levers 44.1, 44.2. The detection frame 43 is connected to two anchors 45.1, 45.2, which are arranged on opposite sides of the frame 43. A pivot 46.1 having an axis of rotation parallel to y-direction connects the detection lever 44.1 to the anchor 45.1. The connection between the lever 44.2 and the anchor 45.2 as well as the pivot 46.2 are mirror symmetrical with respect to the x-axis of the sensor. Therefore, the detection frame 43 can rock about the y-axis.

The sensing plate 41 is coupled to the outer end of each of the detection levers 44.1, 44.2 by an out-of-plane coupling structure 47.1, 47.2, respectively. Said out-of-plane coupling structures 47.1, 47.2 are elongate in y-direction and mirror symmetrical with respect to the x-axis of the sensor. Their length in y-direction is about half of the width of the sensing plate 41 in y-direction.

The out-of-plane coupling structure may comprise four parallel main beams A, B, C, D, oriented in y-direction and connected to each other at their first end by a short transverse beam (orthogonal to the main beams). The second ends of the two inner main beams B, C of the four beams are attached to the detection lever 44.1 and the second ends of the two outer main beams A, D to the sensing plate 41.

The sensing plate 41 comprises three plate parts 41.1, . . . , 41.3.

The first part 41.1 has a rectangular overall shape that is elongate in y-direction. The first part 41.1 has the longest distance of all three plate parts from the axis of the pivot 46 (y-axis). It has four recesses in its rectangular overall shape, namely two recesses for housing the out-of-plane coupling structures 47.1, 47.2 and two recesses for housing two anchors 48.1, 48.2. The anchors 48.1, 48.2 are closer to the y-axis than the out-of-plane coupling structures 47.1, 47.2.

The second plate part 41.2 is elongate in x-direction and its dimension in y-direction is smaller (e.g. 5 to 10 times smaller) than the dimension of the first part 41.1 in y-direction. The first and the second plate part 41.1, 41.2 together exhibit the shape of a "T".

The third plate part 41.3 is that one that is closest to the y-axis of the sensor. It is elongate in y-direction but not as long in y-direction as the first plate part 41.1. It is also smaller than the first plate part 41.1 in x-direction. There are two recesses in the third plate part 41.3 for pivot elements 49.1, 49.2, which connect the sensing plate 41 to the drive mass 50. The third and the second plate part 41.3, 41.2 together exhibit the shape of an "inverted T".

The drive mass 50 has an overall rectangular shape defined by the frame beams 50.1, . . . , 50.5. The frame 50 is not closed but has an opening between the frame beams 50.1, 50.5, which are most distant to the y-axis of the sensor. The plate part 41.2, which extends in x-direction runs though the opening in the drive mass frame. Therefore, the sensing plate 41 is partly within and partly outside the drive mass frame.

The pivot elements 49.1, 49.2, which are arranged at a distance (in x-direction) from the out-of-plane coupling structure, are coupling the sensing plate 41 to a geometric reference plane, which is at a fixed distance above the substrate plane, so that the sensing plate performs a tilting out-of-plane movement.

The drive mass 50 is suspended to be able to vibrate in x-direction without moving in y-direction or in z-direction. The outer end of the drive masse (namely the frame beams 50.1 and 50.5) are connected to the anchors 48.1 and 48.1, respectively, by x-springs 51.1, 51.2. The x-springs 51.1, 51.2 are flexible in x-direction but stiff in y- and z-direction. According to a specific embodiment of the invention, said x-springs 51.1, 51.2 consist of a folded beam structure, namely at least two slender beams extending in y-direction and being connected pair-wise to each other at one of their ends. In fact, any meander-like shape is useful to work as an x-spring. FIG. 4 shows a structure consisting of several 0-shapes (or narrow rectangles) connected to each at the center of the elongate side: "0-0-0-0"-shape (quadruple-0 shape).

The inner frame beam 50.3 (i.e. the part of the drive mass 50 that is closest to the y-axis) is connected by two x-springs 51.3, 51.4 to a coupling plate 52, which is elongate in y-direction. The x-springs 51.3, 51.4 are similar to the x-springs 41.1, 51.2. In the particular embodiment they have a triple-0 shape: "0-0-0"-shape.

The coupling plate 52 is connected at its center (in y-direction) to the anti-phase coupling spring 53. The function of the anti-phase coupling spring 53 is to couple the x-direction movement of the sensing plates 41 and 42 so that the anti-phase movement is enforced and the in-phase movement is suppressed. According to a preferred embodiment the anti-phase coupling spring 53 has the shape of a rhombus. It is preferably elongate in y-direction. Its length in y-direction is about the same as the dimension of the sensing plate 41 in y-direction. The coupling plate 52 is connected to that corner 53.1 of the rhombic spring 53 that has an angle >90°. The pointed corners 53.2, 53.3 of the rhombic spring 53, which have an angle <90°, are oriented in y-direction and are connected to the center of a slender beam 54.1, 54.2, respectively. The beams 54.1, 54.2 are oriented in x-direction and are attached at both ends to an anchor 55.1, 55.2, respectively. The anchors 55.1, 55.2 have rectangular overall shape but are provided with openings (free areas) for the beams 54.1, 54.2 and for the pointed corners 53.2, 53.3 of the rhombic spring 53.

Figure 5:
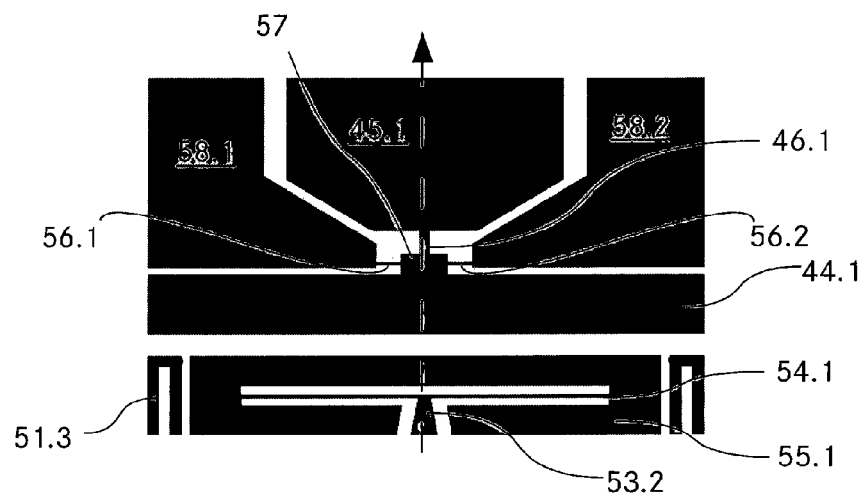
FIG. 5 a top plan view section relating to the detection structure.

FIG. 5 shows an enlarged top plan view of the rotation detection structure. The detection lever 44.1 has a protruding butt element 57. The pivot 46.1 is connected to the butt element 57. (The pivot 46.1 may be realized by a straight beam in y-direction having a sufficient torsional resilience.) The butt element 57 protrudes in y-direction and provides two lateral shoulders at a distance from the y-axis. Two nano-wire gauges 56.1, 56.2 are provided between the two lateral shoulders and two anchors 58.1, 58.2. The three anchors 45.1, 58.1, 58.2 each carry an electrode layer for a contact to measure the resistance variation of the piezoresistive nano-wire gauge 56.1, 56.2 due to an out-of-plane rocking movement of the lever 44.1.

FIG. 4 also shows the electrostatic drive means for the drive mass 50. There are four drive electrodes 59.1, . . . , 59.4 arranged within a free area provided in the drive mass 50. According to a preferred embodiment, there are two frame beams 50.6, 50.7 within the rectangular shape of the drive mass 50. Said frame beams 50.6, 50.7 are connected to frame beams 50.2, 50.4 and are oriented in y-direction in a mirror symmetric way with respect to the x-axis. The drive electrodes 59.1, 59.2 are arranged between the frame beams 50.1 and 50.5, i.e. in an area that is further away from the y-axis (which is defined by the pivot 46.1, 46.2) than the plate part 41.3 of the detection plate 41.

The sensor according to FIGS. 4, 5 is mirror symmetrical with respect to x and y-axis. The anchors 45.1, 45.2, 55.1, 55.2, the pivots 46.1, 46.2 and the pointed corners 53.2, 53.3 of the anti-phase coupling spring 53 are arranged on the y-axis of the sensor. The coupling plate 52, which is placed between the anchors 55.1, 55.2, is at a short distance from the y-axis. The coupling plate 52 is, therefore, the innermost element with respect to the distance to the y-axis.

coupling plate 52 (innermost=closest to y-axis)
    x-springs 51.3, 51.4
    frame beam 50.3 (innermost part of the drive mass 50)
    plate part 41.3 (innermost part of the sense plate 41)
    pivot element 49.1, 49.2
    frame beam 50.6, 50.7
    drive electrodes 59.1, . . . , 59.4
    frame beam 50.1, 50.5
    x-spring 51.1, 51.2
    anchor 48.1, 48.2
    plate part 41.1 (outermost part of the sense plate 41)
    coupling structure 47.1, 47.2
    connection beam 44.3, 44.4 (outermost=most distant from y-axis)

The above listing tells e.g. that the frame beams 50.1, 50.5 are closer to the y-axis than the anchors 48.1, 48.2; or that the coupling structure 47.1, 47.2 is further away from the y-axis than the pivot elements 49.1, 49.2; etc.

Operation:

The electrodes 59.1, . . . , 59.4 are fed with a an electric drive signal that forces the drive mass 50 to vibrate at a predetermined frequency in x-direction. Due to the suspension by the x-springs 51.1, . . . , 51.4 the drive mass 50 can only move in x-direction but not in y-direction or z-direction. The two pivot elements 49.1, 49.2 are stiff in x and y-direction so that the movement of the drive mass 50 is transmitted to the sensing plate 41. The x-direction vibration of the sensing plate is not transmitted to the detection frame 43, because the out-of-plane coupling structure 47.1, 47.2 is flexible (soft) in x-direction and because the detection frame 43 is not mobile in x- and y-direction.

If a rotation rate of the sensor takes place in y-direction the sensing plates 41, 42 are also moving in z-direction. Due to the specific suspension of the sensing plates they start to tilt out-of-plane. While the plate part 41.3 is primarily kept in the reference plane defined by the pivot elements 46.1, 46.2, the plate part 41.1 moves substantially out of the reference plane. This out-of-plane movement is coupled to the detection frame 43 so that the lever 44.1 starts to rock about the y-axis defined by the pivot 46.

Figure 6:
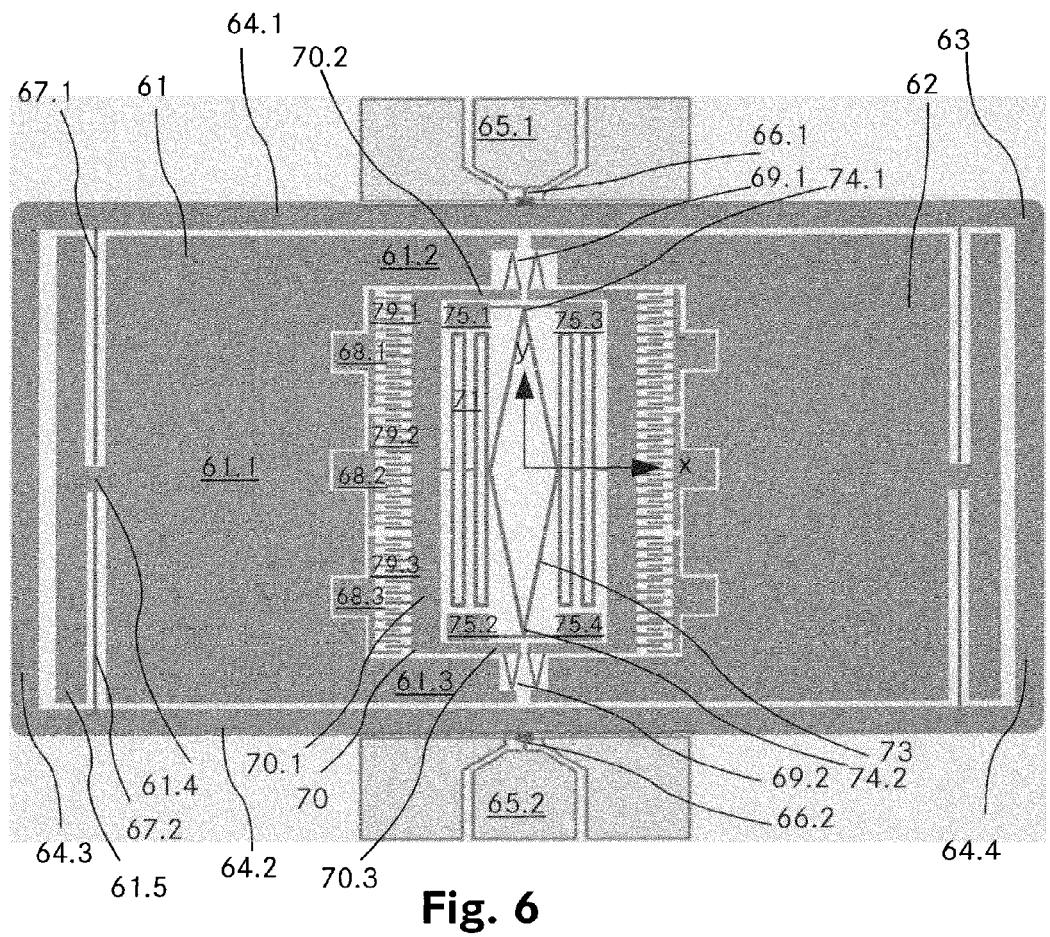
FIG. 6 a top plan view of an embodiment in which the sensing plate is outside the drive mass.

FIG. 6 shows the top plan view of the MEMS structure of another embodiment of the invention. The structure may be used as a y-axis gyroscope. The geometric design is symmetrical with respect to x- and y-direction. Therefore, the following description is limited to one side of the symmetrical design.

There are two sensing plates 61, 62 which define the sensing mass of the tuning-fork type sensor. The sensing plates 61, 62 are enclosed within a rectangular detection frame 63. The long sides of the frame 63 are parallel to x-direction and define each a detection lever 64.1, 64.2. The free ends of the detection levers 64.1, 64.2 are connected by two connection beams 64.3, 64.4, which are parallel to y-direction and define a closed rectangle together with the detection levers 64.1, 64.2. The detection frame 63 is connected to two anchors 65.1, 65.2, which are arranged on opposite sides of the frame 63 (note: opposite sides with respect to the x-axis). A pivot 66.1 having an axis of rotation parallel to y-direction connects the detection lever 64.1 to the anchor 65.1. The connection between the lever 64.2 and the anchor 65.2 as well as the pivot 66.2 are mirror symmetrical to anchor 65.1, lever 64.2 and pivot 66.2 with respect to the x-axis of the sensor. Therefore, the detection frame 63 can rock about the y-axis.

The sensing plate 61 is coupled to the outer end of each of the detection levers 64.1, 64.2 by an out-of-plane coupling structure 67.1, 67.2, respectively. Said out-of-plane coupling structures 67.1, 67.2 are elongate in y-direction and arranged mirror symmetrical to each other with respect to the x-axis of the sensor. Their length (in y-direction) is about half of the width of the sensing plate 61 (in y-direction). They are in the area of the outer end of the plate part 61.1.

So far the design shown in FIG. 6 is similar to that one shown in FIG. 4. It is to be mentioned that the out-of-plane coupling structures 67.1, 67.2 is shown as a straight beam in FIG. 6 but that it could also be designed in the same way as the structure 47.1 in FIG. 4. What matters is its softness along X, and high stiffness along Y and Z.

In contrast to the out-of-plane coupling structure 47.1 shown in FIG. 4 the out-of-plane coupling structure 67.1 of FIG. 6 is a straight beam, one end of the beam being connected to the inside of the detection frame 63 (at the outer end of the detection lever 64.1) and the other end of the beam being connected to the sensing plate 61 (at the outer end of the sensing plate). In the present embodiment the sensing plate 61 has two slots extending in y-direction for housing the out-of-plane coupling structures 67.1, 67.2. On the x-axis (=central axis of symmetry) of the sensing plate 61, there is a bridging plate part 61.4 of the sensing plate 61 for separating the ends of the slots from each other.

The sensing plate 61 comprises five plate parts 61.1, . . . , 61.5. The main portion of the sensing mass is defined by the rectangular plate part 61.1 which extends between the two detection levers 64.1, 64.2. The two plate parts 61.3. 61.4 extend parallel to the detection levers 64.1, 64.2 and adjacent to said levers. These two plate parts 61.3, 61.4 extend from inner end of the plate part 61.1 to the pivot elements 69.1, 69.2, wherein said pivot elements 69.1, 69.1 are close to the y-axis (compared to the center of gravity of plate part 61.1).

The outer end of the sensing plate 61 is formed by a plate part 61.5 which is slim in x-direction compared to the plate part 61.1. Plate part 61.5 may be omitted.

The plate parts 61.1, 61.2 and 61.3 enclose a substantially rectangular (inner) area for the drive structure. That is, the drive structure is inside the area encompassed by the sensing plate 61.

The drive structure comprises several (e.g. three) anchors 68.1, . . . , 68.3, each having a drive electrode 79.1, . . . , 79.3 cooperating with corresponding finger electrodes provided at the outer end of the drive mass 70. The drive mass 70 is substantially C-shaped, having a may beam 70.1 extending parallel to the y-axis and two arms 70.2, 70.3 extending parallel to the x-axis. The inner end of each of the two arms is connected to the pivot element 69.1, 69.2.

The drive mass 70 is suspended by means of an x-spring 71, which has for instance a double-0 shape: "0-0". The x-spring 71 is within the area encompassed by the C-shaped drive mass 70. The inner end of the x-spring 71 is connected to an anti-phase coupling spring 73, which is designed similar to the anti-phase coupling spring 53 shown in FIG. 4. Each of the pointed ends 74.1, 74.2 of the anti-phase coupling spring 73 is connected to the middle of a flexible beam, which is oriented in x-direction. The two ends of each of the flexible beams are connected to two anchors 75.1, 75.3 and 75.2, 75.4, respectively. Two of said anchors 75.1, . . . , 75.2 are within the area encompassed by the drive mass 70. In the present embodiment, said anchors 75.1, . . . , 75.2 are between the x-spring 71 and the arms 70.2, 70.3.

The sensor according to FIG. 6 is mirror symmetrical with respect to x- and y-axis. The anchors 65.1, 65.2, the pivots 66.1, 66.2 and the pointed ends 74.1, 74.2 of the anti-phase coupling spring 73 are arranged on the y-axis of the sensor. The x-spring 71, which is placed between the anchors 75.1, 75.2, is at a short distance from the y-axis. The x-spring 71 is, therefore, not on the y-axis but the innermost element (with respect to the distance to the y-axis) of all other elements:

pivot element 69.1, 69.2 (innermost=closest to y-axis)
x-spring 71
main beam of drive mass 70.1 (outermost part of the drive mass 70)
drive electrodes 79.1, . . . , 79.3
anchors 68.1, . . . , 68.3
plate part (main mass) 61.1
coupling structure 67.1, 67.2
plate part 61.5 (outermost part of the sense plate 61)
connection beam 64.3

The above listing tells e.g. that the main beam of drive mass 70.1 is closer to the y-axis than the plate part 61.1; or that drive electrodes 79.1, . . . , 79.3 are outside the drive mass 70.1 while the x-spring 71 is inside the drive mass 70. The coupling structure 67.1, 67.2 has a much bigger distance from the y-axis than the pivot elements 69.1, 69.2.

Operation:

The operation is basically the same as that of FIG. 4. The drive mass 70 is actuated to vibrate in x-direction. Due to the suspension via x-spring 71, anti-phase coupling spring 73 and anchors 75.1, . . . , 75.4, the drive mass 70 only vibrates within the x-y-plane (in-plane vibration). This vibration is transmitted via pivots 69.1, 69.2 to the sensing plate 61. If there is an out-of-plane force (Coriolis force), the outer end of the sensing plate 61 performs a tilting out-of-plane movement. The z-component of this movement is transmitted via the coupling structures 67.1, 67.2 to the detection frame 63. The rotation of the frame 63 about the y-axis is detected by a nano-wire gauge (or by some other suitable detection means).

FIGS. 7*a, b, c* show the sensor design of FIG. 6 with a different type of pivot element between the drive mass 70 and the sensing plate 61. Instead of the V-shaped structure 69.1, 69.2 of FIG. 6, there is a flexible layer forming a sheet-like element. FIGS. 7*b, c* show clearly, that the inner end of sensing plate part, namely arm 81.3 (which corresponds to sensing plate part 61.3) is connected to the inner end of the drive mass part 80.3 (which corresponds to the arm 70.3). The main volume of the sensing plate 81 and of the drive mass 80 consists of a crystalline silicon layer of e.g. several 100 micron thickness. This layer is machined by means of standard methods (known in the art) in such a way that the preferred geometric sensor design (e.g. as shown in FIG. 4 or 6) is achieved. According to a preferred embodiment of the invention, the crystalline top layer 82 is arranged on top of a thin crystalline layer 83, which has a thickness of typically less than 1 micron (e.g. 250-500 nanometer). The thin layer 83 is also used to implement the nano-wire gauge (56.1, 56.2 in FIG. 5). Due to the fact that the top layer 82 is removed between the drive mass 80 and the sensing plate 81 to form a gap 84, the connection between the drive mass 80 and the sensing plate 81 is a sheet-like element 83.1 that is thin and flexible in z-direction. The thin crystalline layer 83 is connected to the drive mass on the one side and to the sensing plate on the other side.

Therefore, the rocking movement about the y-axis as shown in FIG. 7*c* is possible, while a rotation about the x- or z-axis is blocked.

Figure 8:
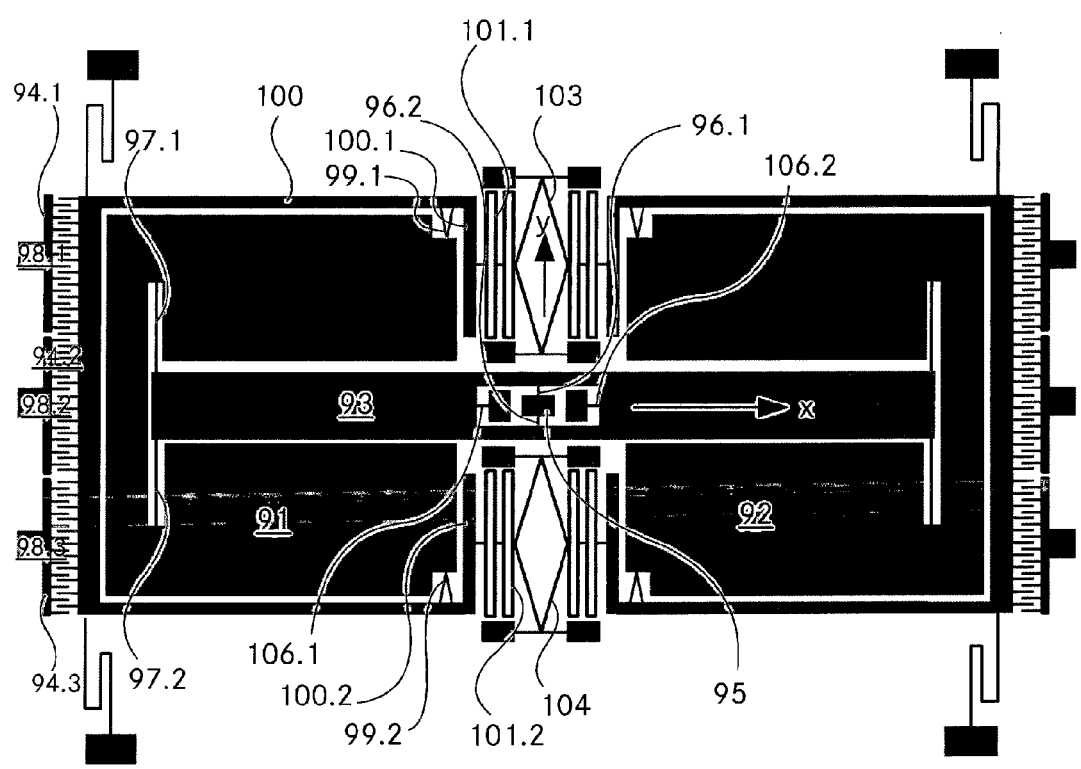
FIG. 8 a top plan view of an embodiment in which the detection arm is inside the drive mass.

FIG. 8 shows a further embodiment. A first difference to the embodiment of FIG. 4 is that the drive mass 100 has the shape of a frame that is surrounding the sensing plate 91. A second difference is that the drive electrodes are placed at the outside of the drive mass frame. In fact, the outer-most parts of the drive mass 100 is provided with finger electrodes extending in x-direction and opposite to the finger electrodes are fixed electrodes 94.1, . . . , 94.3 that are attached to anchors 98.1, . . . , 98.3.

A third difference is that the detection lever 93 is placed on the x-axis in the center of the two sensing plates 91, 92. The detection lever 93 has an opening in its center for the anchor 95 (which is in the center of the sensor) and the two nano-wire gauge structures 106.1, 106.2. There are two pivots 96.1, 96.2 extending in y-direction and connecting the detection lever 93 to the anchor 95. When the detection lever is rocking about the y-axis the two nano-wire gauge structures 106.1, 106.2, which extend in x-direction, are alternatively stretched. It is, therefore, possible to implement a differential detection scheme.

The detection lever 93 is coupled to the sensing plate 91 by two coupling structures 97.1, 97.2 for coupling the out-of-plane component of the tilting movement of the sensing plate 91 to the detection lever 93. As shown in FIG. 8, the out-of-plane coupling structure may be a straight beam extending in y-direction. The straight beam is soft in x-direction but stiff in y- and z-direction.

The inner end of the sensing plate 91 (i.e. the end that is closest to the y-axis) is connected to the drive mass 100 by two pivot elements 99.1, 99.2 oriented in y-direction.

The frame of the drive mass 100 encloses the sensing plate 91 at all four sides. The frame 100 has only one opening, which is arranged in the area of the x-axis so that the detection lever 93 can extend from the anchor 95 (which is outside the drive mass frame) into the inside of the drive mass 100. The two frame sections 100.1, 100.2 of the drive mass 100 are suspended via two x-springs 101.1, 101.2, two anti-phase coupling springs 103, 104 and eight anchors. The x-spring 101.1, the anti-phase coupling spring 103 and the corresponding four anchors have substantially the same design as the x-spring 71, the anti-phase coupling 73 and the four anchors 75.1, . . . , 75.4 shown in FIG. 6.

The operation is substantially the same as that of FIGS. 4 and 6: The drive electrodes 94.1, . . . , 94.4 generate a vibration of the drive mass 100 in x-direction. Pivots 99.1, 99.2 transmit the vibration to the sensing plate 61. If a Coriolis force is effective in z-direction, a tilting out-of-plane movement of the sensing plate is effected. The z-component of the tilting movement is transmitted via coupling structure 97.1, 97.2 to the detection lever 93, which is in the center.

The embodiments shown in the drawings may be modified in different ways without leaving the scope of the invention.

Instead of placing the pivot element inside the area enclosed by the drive mass 50, it may be placed outside. For instance, if a space is provided between the lever 44.1 and the frame beam 50.2 a plate part of the sensing plate may be arranged in said space and the pivot 49.1 may be pointing away from x-axis (instead of pointing towards the x-axis as shown in FIG. 4).

It is not necessary that the sensing plate 41 extends into the area encompassed by the drive mass 50. The sensing plate 41 may also surround the drive mass.

The anchors 48.1, 48.2, which support the drive mass 50 in the reference plane, can also be placed inside (i.e. in an area surrounded by) the drive mass 50. In such a case, the drive mass might well be a closed frame or ring (instead of a C-shape structure as shown in FIG. 4).

The anti-phase coupling of the two sensing plates 41, 42 can be achieved by other spring-structures than those shown in FIG. 4.

The shape of the detection frame or the sensing plates does not have to be rectangular. Polygonal, rhombic or circular shapes are also possible.

The out-of-plane movement of the detection levers 44.1, 44.2 could be measured by electrostatic electrodes.

The invention is not limited to tuning-fork sensors, which require an actuation in x-direction. In particular, the suspension that generates a tilting out-of-plane movement as shown in FIG. 2 or 3 may be used for detecting a linear z-direction acceleration. It is also possible to provide magnetic material on the sensing plate and to detect magnetic fields in z-direction.

The pivot for the out of plane coupling is not necessarily connecting the end of the detection arm and the outer end of the sensing plate. The sensing plate or the detection arm may extend beyond said pivot. In a similar manner, the pivot for coupling the sensing plate to the reference plane does not necessarily have to be at the inner end of the sensing plate.

The sensor of the invention may be implemented on a single chip together with other sensors to provide a sensor device with 9 degrees of freedom, namely 3 linear accelerations, 3 magnetic directions and 3 rotation rates (3A+3M+3G).

The invention claimed is:
1. A sensor for measuring physical parameters such as acceleration, rotation, magnetic field, comprising a) a substrate defining a substrate plane,
b) at least one sensing plate suspended above the substrate for performing a movement having at least a first component in a sensing direction, wherein the sensing direction is orthogonal to the substrate plane,
c) at least one detection arm that is suspended above the substrate for performing a rotational movement about a rotation axis parallel to the substrate plane,
d) an out-of-plane coupling structure for coupling the first component of the movement of said sensing plate to said detection arm for generating the rotational movement of the detection arm,
e) a rotation detection structure cooperating with the detection arm for detecting the rotational movement of the detection arm with respect to the substrate plane,
f) characterized by a pivot element arranged at a distance from the out-of-plane coupling structure, said pivot element coupling the sensing plate to a geometric reference plane, which is at a fixed distance above the substrate, so that the sensing plate performs a tilting out-of-plane movement.

2. The sensor according to claim 1, further comprising a drive mass suspended for performing a movement in a drive direction parallel to the substrate plane and a drive structure for actuating the drive mass in the drive direction.

3. The sensor according to claim 2, wherein the drive mass is coupled to the sensing plate by said pivot element.

4. The sensor according to claim 3, wherein the pivot element is v-shaped and is pointing in a direction perpendicular to the drive direction.

5. The sensor according to claim 3, wherein the pivot element is a flexible sheet-like element.

6. The sensor according to claim 2, wherein the drive mass has the shape of a frame.

7. The sensor according to claim 2, wherein the out-of-plane coupling structure is outside an area encompassed by the drive mass.

8. The sensor according to claim 2, wherein the out-of-plane coupling structure is inside an area encompassed by the drive mass.

9. The sensor according to claim 2, wherein an electrostatic drive unit for generating the drive movement is arranged inside the area encompassed by the detection structure.

10. The sensor according to claim 2, wherein an electrostatic drive unit for generating the drive movement is arranged outside the area encompassed by the drive mass.

11. The sensor according to claim 2, wherein the drive mass is flexibly connected to an anchor arranged outside the area encompassed by the drive mass and inside the area encompassed by the sensing plate.

12. The sensor according to claim 2, wherein the drive mass is flexibly connected to an anchor arranged outside the area encompassed by the drive mass.

13. The sensor according to claim 1, wherein the detection arm is part of a detection structure that has the shape of a frame surrounding the sensing plate.

14. The sensor according to claim 1, wherein the detection arm is arranged in an opening of the sensing plate.

15. The sensor according to claim 1 wherein the sensing plate, the drive mass and the detection arm are symmetric with respect to an axis, which is parallel to the substrate plane and orthogonal to the rotation axis of the detection arm.

16. The sensor according to claim 1, further comprising a second sensing plate, a second out-of-plane coupling structure for coupling the first component of the movement of said second sensing plate to said detection arm for generating the rotational movement of the detection arm.

17. The sensor according to claim 16, further comprising an anti-phase coupling structure for anti-phase coupling of the movement of the at least one sensing plate and the second sensing plate in a drive direction.

18. The sensor according to claim 17, wherein the anti-phase coupling structure is anchored to the substrate.

19. The sensor according to claim 1, wherein the out-of-plane coupling structure is arranged at an outer end of the sensing plate with respect to said rotation axis.

20. The sensor according to claim 1, wherein the rotation detection structure comprises a piezoresistive nano-wire gauge or a resonator gauge.

21. The sensor according to claim 1, wherein the rotation detection structure comprises a flexible layer that functions as a piezoresistive element that transforms the out-of-plane displacement of the detection arm into an electric signal.

* * * * *